(12) United States Patent
Fraizer

(10) Patent No.: US 6,520,650 B2
(45) Date of Patent: *Feb. 18, 2003

(54) LAMP REFLECTOR WITH A BARRIER COATING OF A PLASMA POLYMER

(75) Inventor: Robert L. Fraizer, Seymour, IN (US)

(73) Assignee: Valeo Sylvania L.C.C., Seymour, IN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,218

(22) Filed: Feb. 8, 1999

(65) Prior Publication Data

US 2002/0154407 A1 Oct. 24, 2002

(51) Int. Cl.$^7$ ............ G02B 5/10; G02B 7/182; F21V 7/00; C08E 2/46

(52) U.S. Cl. ............ 359/514; 359/869; 359/883; 359/884; 362/341; 427/488; 428/447; 428/448; 428/450

(58) Field of Search .............. 359/507, 584, 359/585, 588, 869, 871, 883, 884, 514; 362/341; 428/447, 448, 450; 427/488

(56) References Cited

U.S. PATENT DOCUMENTS

| | | | |
|---|---|---|---|
| 2,699,402 A | * | 1/1955 | Meyer |
| 2,993,806 A | * | 7/1961 | Fisher et al. |
| 4,029,842 A | | 6/1977 | Yoshida et al. |
| 4,085,248 A | | 4/1978 | Zehender et al. |
| 4,137,368 A | | 1/1979 | Wydeven et al. |
| 4,140,670 A | | 2/1979 | Charles |
| 4,284,736 A | | 8/1981 | Comstock et al. |
| 4,340,646 A | | 7/1982 | Ohno et al. |
| 4,358,507 A | | 11/1982 | Senaha et al. |
| 4,425,287 A | | 1/1984 | Hesse et al. |
| 4,429,004 A | | 1/1984 | Breitenfellner |
| 4,622,354 A | | 11/1986 | Iseler et al. |
| 4,666,263 A | | 5/1987 | Petcavich |
| 4,686,150 A | | 8/1987 | Talley et al. |
| 4,762,730 A | | 8/1988 | Enke |
| 4,830,873 A | | 5/1989 | Benz et al. |
| 4,835,213 A | | 5/1989 | Murai |
| 4,956,196 A | * | 9/1990 | Wagner et al. |
| 4,961,994 A | * | 10/1990 | Cariou et al. |
| 5,045,344 A | | 9/1991 | Pinkhasov |
| 5,051,308 A | | 9/1991 | Reed et al. |
| 5,143,964 A | | 9/1992 | Behar et al. |
| 5,211,995 A | | 5/1993 | Kuehnle et al. |
| 5,216,551 A | | 6/1993 | Fujii |
| 5,256,446 A | * | 10/1993 | Bugen |
| 5,294,464 A | * | 3/1994 | Geisler et al. |
| 5,320,875 A | | 6/1994 | Hu et al. |
| 5,378,284 A | | 1/1995 | Geisler et al. |
| 5,487,810 A | * | 1/1996 | Thurm et al. |
| 5,493,483 A | | 2/1996 | Lake |
| 5,520,741 A | | 5/1996 | Schneider et al. |
| 5,718,967 A | | 2/1998 | Hu et al. |
| 5,846,649 A | | 12/1998 | Knapp et al. |
| 5,849,366 A | | 12/1998 | Plester |
| 5,865,530 A | * | 2/1999 | Weber |
| 5,897,925 A | | 4/1999 | Huang |

* cited by examiner

Primary Examiner—Ricky D. Shafer
(74) Attorney, Agent, or Firm—William E. Meyer

(57) ABSTRACT

A no base coat vehicle headlamp reflector can be improved with a plasma deposited layer of a siloxane material. The siloxane layer acts as an barrier layer formed directly on the vehicle reflector. The vehicle headlamp reflector with no base coat, but an barrier layer yields a resin lamp interior protected from upsets in the reflective layer and from outgasing condensate. The lamp reflector coated with plasma polymer of methanol yields a plastic lamp reflector resistant to condensation forming thereon, and resistant to attach by water vapor.

6 Claims, 5 Drawing Sheets

LAMP REFLECTOR WITH A BARRIER COATING OF A PLASMA POLYMER

TECHNICAL FIELD

The invention relates to electric lamps and particularly to plastic electric lamp reflectors. More particularly the invention is concerned with plastic body lamp reflector with a protective barrier layer.

BACKGROUND ART

Headlamps used to be made from glass. The glass rarely reacted chemically with the lamp fill materials, and rarely if ever contributed, or outgassed materials into the lamp process. Automotive headlamps are now predominantly plastic, and the trend is to apply plastic to all vehicle lamps. To lower material costs, the shell material is extended or filled with less expensive materials, such mica or glass fiber. These filled resin materials are referred to as bulk molding compounds, or BMC. The fill material tends to cause a rough surface. The shell is then frequently coated with a liquid base coat to prepare the reflective regions to have a very high degree of smoothness. These smoothing materials, such as an acrylic urethane, flow over and fill in the crevices left in surface of the shell. The base coating material is expensive. The base coating can also be difficult to properly apply, as it tends to run, drip and splatter. Also, pits in the reflector shell can be filled by the liquid, but only dried to have surface skin. The interior liquid then erupts during evacuation, leaving a surface hole, and splattered material in the equipment. The base coating can also be an environmentally offensive material. The flow coating method is further described in U.S. Pat. No. 5,493,483. There is then a general need for reflector without a base coat. The hard, smooth base coat layer is then metallized, for example by vapor deposition or sputtering of aluminum on the shell interior to form a mirror like reflector. Although not strictly necessary, the reflective coating is then coated with an environmental sealer to limit or stop water or other materials from tarnishing the mirror surface. The sealer is commonly silicon monoxide.

So called, no base coat reflectors have been developed. Relying on a combination controlled material formulation, tooling and processing, reflectors can be made with a sufficiently smooth surface that no base coat is needed, even if the resin material includes fillers. The metallization layer is then applied directly on the formed resin surface. Elimination of the base coating is considered to be a significant improvement in reflector manufacture. Unfortunately, the resin materials can outgas solvents, or other low molecular weight resin constituents that then drift freely in the interior cavity. It is a normal characteristic of the raw plastic material to include mobile solvents or similar mobile components that enable the material to be soft and pliable for molding. After molding, the remaining solvent or similar material is superfluous and is normally baked out or allowed to outgas over time. These outgassed materials can condense on the interior surfaces of the vehicle lens, reflector or lamp. The condensed material fogs the light source, the reflector and the lens, and thereby reduces the effective light output. The outgasing material can also lessen the adhesion of the metallization layer, resulting in pin holes, delaminations, wrinkles and similar reflector defects, resulting in uncontrolled light, or glare emitted from the lamp. There is then a need for a no base coat vehicle headlamp reflector that resists outgasing from the shell material.

Headlamp reflectors made from filled bulk molding compound (BMC) have been pre-baked at high temperatures to drive off outgasing materials. This takes time and energy. Alternatively, the reflectors have been flow coated with a base coating which had the effect of encapsulating the surface. Both these methods reduced the out-gassing of the headlamp reflectors at moderate operating temperatures of around 350° F. The new smaller fog lamps and headlamps use higher wattage bulbs and generate more energy thus raising the maximum operating temperatures found in the headlamp reflector systems to above 425° F., resulting in additional outgasing. The higher operating temperature forces a reconsideration of the material choices for headlamp reflectors. While base coating may continue to work as a sealer, base coating is still an expensive and environmentally challenging process. The no base coat headlamp design reduces the cost of forming a durable headlamp reflector by eliminating the base coat material, the coating equipment, the VOC emission controls, shortens the construction cycle time and reduces the labor required to run the process. Unfortunately, eliminating the base coat, eliminates the encapsulation that protected the lamps from the outgas materials. There is then a need for a practical means for sealing shells from outgasing.

A common protective surface coating for the aluminization layer is a plasma deposition of silicon monoxide on the surface, such as Balzer's Protectyl BD 481 065 T or Dow Coming's 200 fluid 0.65 CST. The silicon monoxide protects the aluminization from water attack, but does not protect against water from condensing on the surface or protect from outgassed resin material from collecting on the reflector as a haze. The silicon monoxide is relatively inexpensive to apply in terms of material, and in labor and equipment. There is then a need for an improved surface layer material to eliminate out gassing from the support layers and to protect metallized reflector surfaces from the resulting condensations.

DISCLOSURE OF THE INVENTION

An improved plastic reflector for use with an electric lamp maybe formed from a molded plastic reflector made from a bulk molded compound. The reflector has a first layer of a plasma polymerized material adhered to the inner surface forming a thin film that smoothes the surface of the bulk molded compound; a metal layer of deposited metal adhered to the first layer, and protective overcoating layer adhered to the deposited metal layer.

BEST MODE FOR CARRYING OUT THE INVENTION

Figure 1:
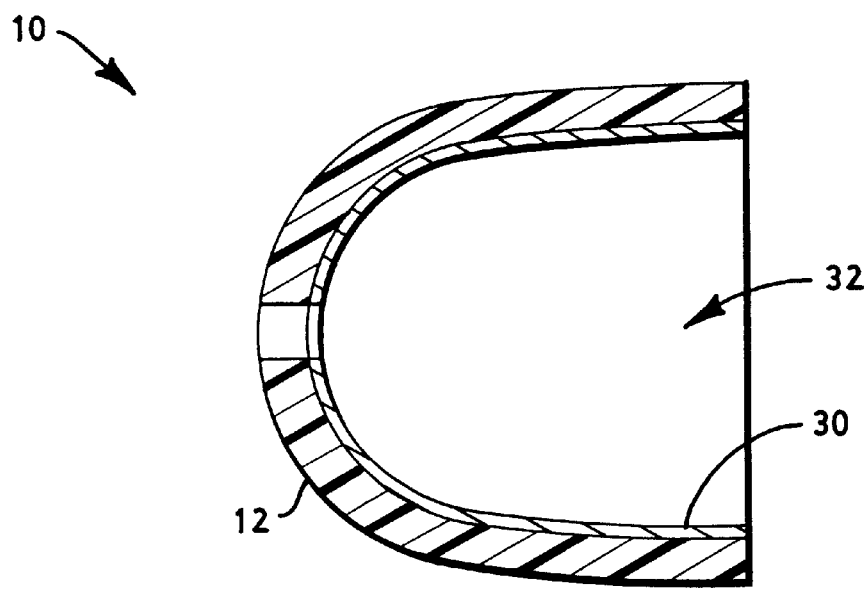
FIG. 1 shows a cross sectional view of a preferred embodiment of a lamp reflector coated with plasma polymer of methanol.
Figure 2:
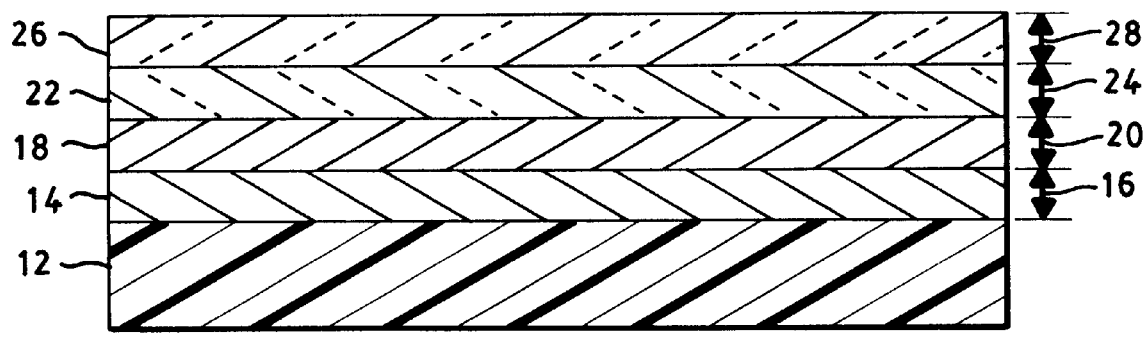
FIGS. 2 to 10 shows a schematic cross sectional views of the layers of preferred embodiments of coated vehicle headlamp reflectors.

FIG. 1 shows a preferred embodiment of a plastic lamp reflector coated with barrier layer formed as a plasma polymer layer. Like reference numbers designate like or corresponding parts throughout the drawings and specification. The barrier coated reflector 10 is assembled from a plastic reflector shell 12, an inner barrier layer 14, a reflective layer 18, an optional outer barrier layer 22 and additional protective layer 26. A lens and related finishing equipment for mounting, aiming and so forth may be added, as may be convenient, and as is generally known.

The reflector shell 12 may be made out of a plastic resin material such as a bulk molding compound (BMC) to have the general form of a hollow shell 12 with a light projection opening. The raw material for the reflector shell 12 includes a resin material, and may include one or more mobile components such as a solvent or similar vaporizable material, any one of which may outgas over time, depending on the temperature and other conditions of operation. The shell 12 includes an interior wall 30 defining an enclosed cavity 32. A portion of the interior wall 30, the reflective region, may be formed to have or include a surface coating to provide a highly reflective surface. The preferred resin material is a bulk molding compound. The preferred reflector is made according to the no base coat reflector formulation substantially as described in U.S. Pat. No. 5,865,530 and hereby incorporated by reference.

An inner barrier layer 14 is formed on the interior wall 30. The inner barrier layer 14 may be made out of a material bondable to the shell 12 material and forming a gas tight barrier thereon. The preferred inner barrier layer 14 provides a lower surface energy than that of the interior wall 30 of the reflector 12. This helps block through migration of materials, and enhances a smoother metallization layer. The preferred inner barrier layer 14 has the general form of a thin layer, sufficiently solid to stop outgasing material from the reflector shell 12 (if any) from passing from the reflector shell 12 into the enclosed cavity 32. Similarly, in a preferred alternative, the inner barrier layer 14 may have sufficient thickness 16 to deter the migration of oxygen into the reflector shell 12.

The preferred inner barrier layer covers all of the shell exposed to the interior cavity, to thereby prohibit any outgasing into the defined cavity. Practically, the inner barrier layer 14 is likely to be effective roughly to the degree the interior wall 30 is coated, and complete effectiveness is desired, so a 100 percent coating is preferred. However, it is understood that a 90% coverage should yield about 90% reduction in outgassed materials, and that may be acceptable in some applications as comparison to the possible difficulties in coating the remaining 10 percent of the interior wall 30.

The inner barrier layer 14 can also enhance the interior wall 30 smoothness, and thereby increase the reflectivity of the final lamp reflector. In the preferred embodiment, the inner barrier layer 14 is a plasma deposited layer of a plasma polymerized siloxane type material. The thickness 16 of the inner barrier layer 14 should be great enough to deter outgasing from the shell 12. It may also be preferred that it be thick enough to smooth over defects in the shell 12, or to deter penetration of oxygen into the shell 12. The thickness 16 should not be so great as to undermine the optical formulation of the reflector. The preferred inner barrier layer 14 has a thickness 16 of from about 0.1 micron to about 0.5 micron.

The preferred inner barrier layer 14 is a plasma polymer of a siloxane material, such as Hexamethyldisiloxane (HMDSO), that is highly oxidized, (silicone dioxide with reduce carbon content). Tetramethyldisiloxane (TMDSO) is an alternative. There are numerous other organosilicons that may work as well. The thickness of the film that seems to work the best on actual FN-10 vehicle lamp reflectors ranged from 0.1 microns to 0.5 microns. This plasma polymer material is believed to be different from any other coating that has been deposited on automotive reflectors in the past. While a single inner barrier layer 14 is described, it should be understood that multiple applications of the same material may be performed at this station, or alternating layers of differing materials may be applied. The thickness of the inner barrier layer 14 should be great enough to deter outgasing from the base reflector. It may also be preferred that it be thick enough to smooth over defects in the base reflector, or to deter penetration of oxygen into the base reflector. The inner barrier layer 14 improves the reflectivity of the reflective layer 18 by reducing outgasing during the vacuum process, allows the aluminum particles to wet the surface better (smoother) and provides a less contaminated surface (cleaner, and smoother).

The reflective layer 18 may be made with an aluminization layer, or similar thin, reflective metal layer. Sputtering is the preferred method for laying down the reflective layer 18 on top of the inner barrier layer 14, but vapor deposition will work. Sometimes silver is used, and other metals may also be used. Aluminum is generally considered to give the best reflection for the least cost. Commonly the aluminum reflective layer 18 is less than 1000 angstroms thick. The preferred aluminum thickness is between about 450 and 900 angstroms with 600 believed to be the best. Ideally, the reflective layer 18 has a smooth and highly reflective surface, providing a mirror like finish. The inner barrier layer 14 directly or indirectly (for example where there is an intermediate layer, such as an enhanced bonding layer) supports the reflective layer 18. The reflective layer 18 may or may not cover the whole of the interior wall 30. In the event the reflective layer 18 does not cover the whole of the interior wall 30, it is still preferred that the inner barrier layer 14 cover the whole of the interior wall 30. The reflective layer itself acts as a barrier layer and helps prevent outgasing, and penetration by oxygen.

Applied over the reflective layer 18 may be an optional outer barrier layer 22. The outer barrier layer 22, may also be formed as a plasma deposition a siloxane material, again such as silicone monoxide (Plasil). The outer barrier layer 22 is designed to keep out water, and thereby preserve the reflective layer 18 from tarnishing or corroding. Silicone monoxide is commonly plasma deposited on the reflective layer 18, as an outer barrier layer 22. The outer barrier layer 22 has a thickness 24 that is usually about 100 nanometers thick and extends at least over the reflective layer 18 at least in the reflective region.

A protective layer 26 is now applied over the reflective layer 18, or the optional outer barrier layer 22, as the case may be. The protective layer 26 formed on the reflective layer 18 provides a clear, protective and hydrophobic coating of the reflective layer 18. The protective layer 26 may be made by plasma polymerization of a hydrocarbon gas or vapor such as methanol (methyl alcohol), but methane and numerous other hydrocarbon gases or vapors may be used. The plasma polymerization of these gases or vapors results in a thin hydrocarbon polymer aggregate layer formed over the outer barrier layer 22. Again the preferred protective layer 26 extends over the reflective region to protect the optically valuable portions of the mirror surface formed on the interior wall 30 of the shell 12. The preferred protective layer 26 has a thickness 28 from 10 to 1000 nanometers. It is believed that the deposited methanol works by depositing extra oxygen atoms to the silicon mono-oxide layer formed by the outer barrier layer 22. If the process time is shortened, the protective layer 26 is thinner, and the surface energy of the coated shell is not sufficiently changed to provide the desired anti-haze protection. If the process time is lengthened, the applied protective layer 26 degrades the outer barrier layer 22, resulting in poor water resistance. The outer barrier layer 22 and the protective layer 26 are more gas permeable than the inner barrier layer 14 and the reflective layer 18, and therefore do not add significantly to the blocking of outgasing styrene or other components.

The preferred method of making the headlamp is to use a plasma deposition machine with single vacuum chamber, but one with multiple deposition stations. The Applicant used a Leybold DynaMet 4V machine, which has four plasma deposition stations in a single evacuated chamber. The machine was modified to have an additional diffusion pump, (A conventional rotary pump could be used.) at the second station to move the polymer gas through the vacuum, while holding a specific pressure. Another modification was the addition of hardware to handle the additional polymer gases at the second station. A third modification was the addition of control and software changes to run the machine with the proper sequencing and timing.

A particular advantage of the present machine structure is that the plasma deposition of the inner barrier layer 14 may be applied with the same jigging and in the same device that the reflective layer 18 is applied, and further, with the outer barrier layer 22, and protective layer 26. The process of manufacture is then to mold the plastic reflector shell 12, and the preferred molding process is according to the no base coat procedure. The molded plastic shell 12 is then positioned in a jig and transferred into a plasma deposition chamber. The preferred chamber has multiple subchambers separated by flexible dividers. The method of forming the plastic lamp reflector resistant to condensation thereon had the following steps:

First a no base coat headlamp reflector was formed from a BMC material substantially according the process described in U.S. Pat. No. 5,865,530. It should be understood that this is the preferred method for getting a smooth, reflective surface, but that other molding processes may be used, and in general any molded BMC or other reflector materials may be used in the present structure and process. To enhance the barrier film, the preferred no base coat reflector has a surface composition of about 57% carbon, 37% oxygen and 6% silicone. The shell 12 is molded to have the form of a thin wall defining a cavity with an interior wall 30. The molded shell 12 is then positioned in a plasma deposition chamber. In one embodiment, the deposition chamber had a single evacuated cavity, with multiple deposition stations. For example, the reflector shell 12 may be rotated in the evacuated chamber from station to station without breaking the vacuum.

The first station provides for the loading and unloading of the plastic shell 12 into the chamber. An initial vacuum may be provided by mechanical vacuum pumps and a roots blower.

The plastic shell 12 is then re-positioned in the second station, (first subchamber) so that its reflective region is treated with a reactive plasma deposition to form an inner barrier coating 14. At the second station an inner barrier layer 14 is then plasma deposited on the interior wall 30. The inner barrier layer 14 may comprise any of numerous siloxane materials that provide an enhancement of the surface and suppress gases from outgasing through the inner barrier layer 14, thereby protecting the reflective layer 18. The preferred material for the inner barrier layer 14 is a highly oxidized siloxane, such as HMDSO. A deposition time of about thirty seconds was found to provide the thinnest inner barrier layer 14 that functioned. Deposition times longer than 1 minute resulted in surfaces that were not glossy, but instead had white haze defects, after metallization. While a single inner barrier layer 14 is described, it should be understood that multiple applications of the same material may be performed at this station, or alternating layers of differing materials may be applied. The thickness of this layer should be great enough to deter outgasing from the plastic shell 12. It may also be preferred that the inner barrier layer 14 be thick enough to change the surface energy to wet the reflective layer 18 better than the material of the reflector shell 12. The inner barrier layer 14 may also smooth over defects in the plastic shell 12, or to deter penetration of oxygen into the plastic shell 12. The thickness 16 should of course not be so great as to undermine the optical formulation of the reflector. The preferred inner barrier layer 14 is plasma deposited hexamethyldisiloxane (HMDSO) with a thickness 16 of about from 0.1 to 0.5 microns.

The shell 12 is then rotated to the next subchamber passing the flexible divider therebetween. The divider is designed to keep the plasma materials from passing between adjacent subchambers. The plastic shell 12, now positioned in the second subchamber, is treated with a plasma deposition of the reflective layer 18 material. The preferred reflective material is aluminum. Aluminum is deposited over the inner barrier layer 14. Sputtering is the preferred method of applying the aluminum do to the higher energy particles of aluminum building a uniform film over the preceding inner barrier layer 14.

The plastic shell 12 is then rotated again through a flexible barrier to a third subchamber for plasma deposition of a protective environmental outer barrier 22. The preferred outer barrier 22 is a resulting silicone monoxide layer (tradename Plasil), used to shield the deposited aluminum from water and other oxidizing materials that might tarnish the aluminum over time. The process for creating the outer barrier 22 can be described as polymerization in a glow discharge, or the bonding of two or more monomers to produce a polymer. Electrons from the glow discharge electrode (cathode) on 4 kV negative high voltage move towards the substrate (anode) which are on ground potential. The electrons collide with the neutral gas molecules of the starting material (HMDSO tradename Protectyl), breaking chemical bonds and initiating the polymerization of the special silicon oil. Fragments which themselves are polymerized form polymerides that condense on the surface of the substrate. The resulting outer barrier 22 is an amorphous, organic, environmental protective coating which is very resistant to chemical influences and withstands temperatures of at least 200° C. The hexamethyldisiloxane which deposits different forms of silicone oxides on the surface after the polymerization of the material. The primary chemical formed over the sputtered aluminum forming the outer barrier 22 is silicone monoxide with more complex substance being silicone dioxide under certain processing conditions. The film however is relatively soft and not resistant to mechanical damage such as scratches. The outer barrier layer 22 is then plasma deposited on the aluminum reflective layer 18. The applicant's current process uses a radio frequency (RF) generator. The RF source produces a power density of 2,000 to 2,500 watts within a working environment of 4.25 sq./ft. The applicant is expecting to increase this to a radio frequency (RF) source producing a power density of about 3,500 to 6,000 watts within a working environment of 4.25 sq./ft. While a single outer barrier layer is described, it should be understood that multiple application of the same material may be performed at this station. The thickness of this outer barrier layer 22 should be great enough to protect the aluminum from environmental damage due to reaction of water with the high purity aluminum. The preferred outer barrier layer 22 of silicone monoxide has a thickness 24 of from 0.02 to 1.5 microns.

The plastic shell 12 remains in the same position for plasma deposition of a protective layer 26. The preferred protective layer 26 provides a clear, low surface energy, hydrophobic material that is deposited on the outer barrier layer 18. The hydrophobic material may be formed by plasma deposition in the presence of a hydrocarbon gas, such as methanol, to form a plasma polymer layer. The plasma polymerization of methyl alcohol has been found to reduce the surface energy of the reflector and thereby resist condensation of water vapor and other materials. The shell 12 is then removed from the deposition chamber and further assembly, such the attachment of a lens and coupling hardware by known methods is completed. The plasma polymerized methanol provides a clear, protective and hydrophobic coating of the reflective layer 18, or the outer barrier layer 22, as the case may be. It is understood that described polymer layer may be used with base coated lamp structures, and a variety of sealing, metallization and other underlying layers, and still benefit from the disclosed condensation resistant polymer layer. The plasma polymerization layer forms a clear, low surface energy, hydrophobic surface layer on the aluminization layer to prevent condensations thereon surface plasma polymer layer of the aluminization layer to a polymer layer.

The chamber is then rotated to station 1, where the chamber is opened and the reflector is retrieved. The various depositions are preformed sequentially in a single chamber, under continuous evacuation. The process is then both clean and rapid. It should be understood that batch vacuum coating systems could be used to provide the various layers. It is believed that batch coating systems would be less efficient, due to the long deposition time of 30 to 45 minutes. Batch coating is then a less preferred method of performing the coating process. It should be understood that completion of the headlamp reflector may proceed as usual with the addition of a lens, support and adjustment hardware, exterior coatings and so forth, as generally known in the art. While there have been shown and described what are at present considered to be the preferred embodiments of the invention, it will be apparent to those skilled in the art that various changes and modifications can be made herein without departing from the scope of the invention defined by the appended claims.

Figure 3:
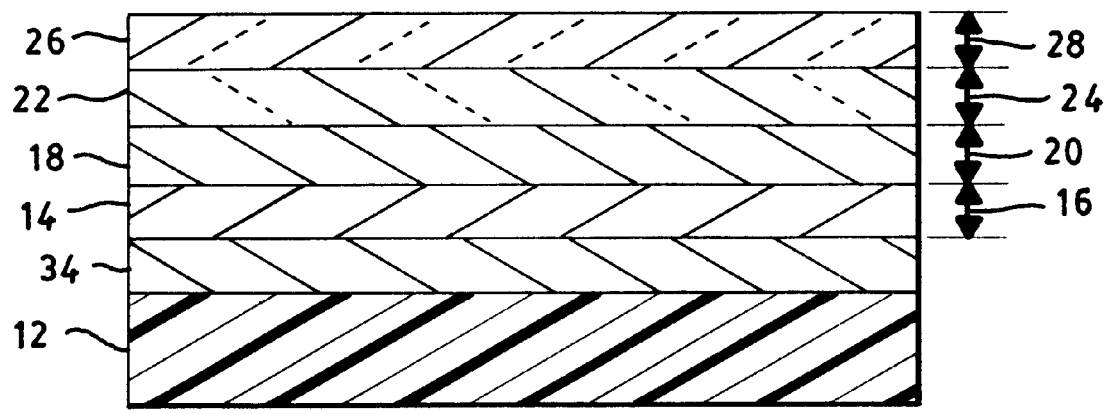

FIG. 3 shows a schematic cross sectional view of the layers of a preferred alternative embodiment of a coated vehicle headlamp reflector. An alternatively preferred structure is to add an additional adhesion promoting layer of tetramethyldisiloxane (TMDSO). Plasma deposited directly on the on the reflector 12, the adhesion layer 34 of TMDSO is then over coated with the inner barrier layer 14. The remaining reflective 18, outer barrier 22 and protective 26 layers then follow in sequence. The adhesion layer 34 is an additional cost in this design. It should be noted that the adhesion layer 34 of plasma deposited TMDSO can be used in this fashion as an additional layer in any of the following layer patterns (FIGS. 4–9), and for purposes of discussion may be considered as merely an alternative way of preparing the reflector 12 before proceeding to any of the subsequent layerings.

Figure 4:
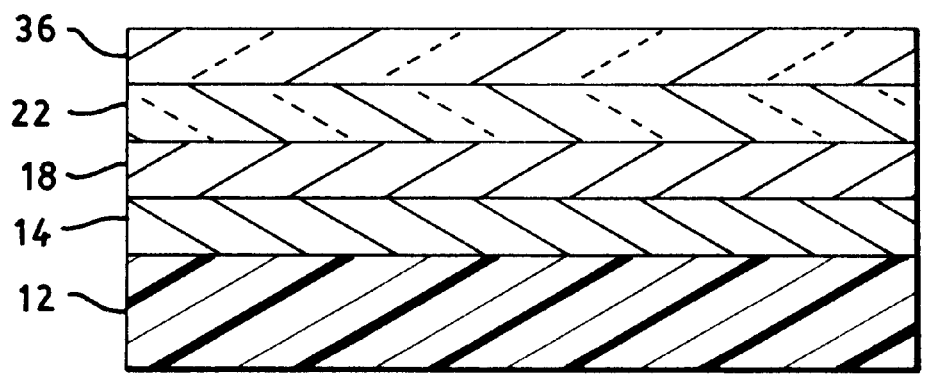
Figure 5:
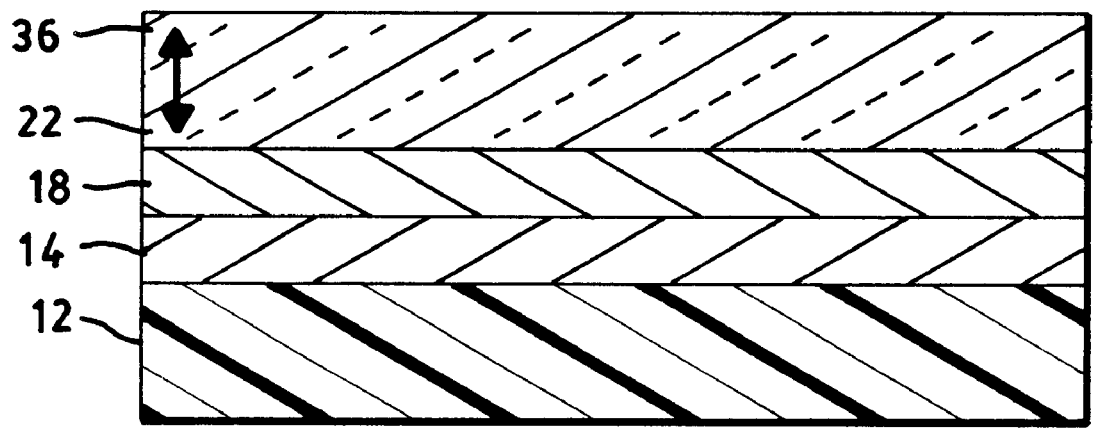

FIG. 4 shows a schematic cross sectional view of the layers of a preferred alternative embodiment of a coated vehicle headlamp reflector. Another alternative is to form the outer barrier layer 22 from HMDSO using the relatively high plasma energy level. On top of the outer barrier layer 22 is formed a first environmental layer 36 which is also a plasma deposition of HMDSO. The first environmental layer 36 is however, completed with about half the plasma energy level as used in forming the outer barrier layer 22. While the starting material, HMDSO is the same, the change in plasma energy, results in a differing structure to the layer which helps resist condensation on the final surface. It is understood that the plasma energy level may be continuously adjusted from a high level to a lower level in forming these two layers, thereby effectively forming a single graded layer instead of two distinct layers (FIG. 5).

Figure 6:
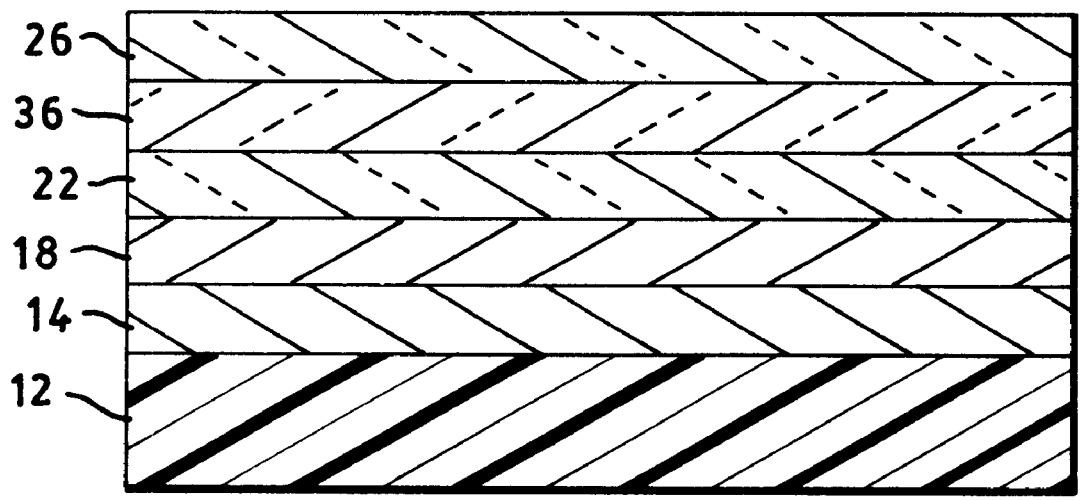

FIG. 6 shows a schematic cross sectional view of the layers of a preferred alternative embodiment of a coated vehicle headlamp reflector. The layered structure in FIG. 6 is the same as in FIG. 4 (alternatively FIG. 5) with the outer barrier layer 22 of HMDSO and first environmental layer 36 of HMDSO. The layered structure is complete with a further addition of a second or final environmental layer 26 of a plasma polymer of methanol that is applied on top of the first environmental layer 36.

Figure 7:
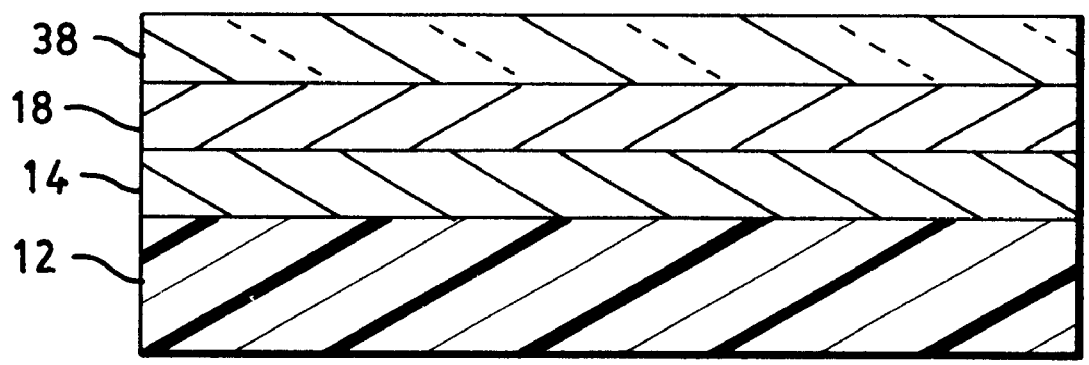

FIG. 7 shows a schematic cross sectional view of the layers of a preferred alternative embodiment of a coated vehicle headlamp reflector. Another alternative is to coat the reflector 12 with the inner barrier layer 14, and the reflective layer 18, and then an environmental layer 38 of a lower energy plasma deposition of HMDSO.

Figure 8:
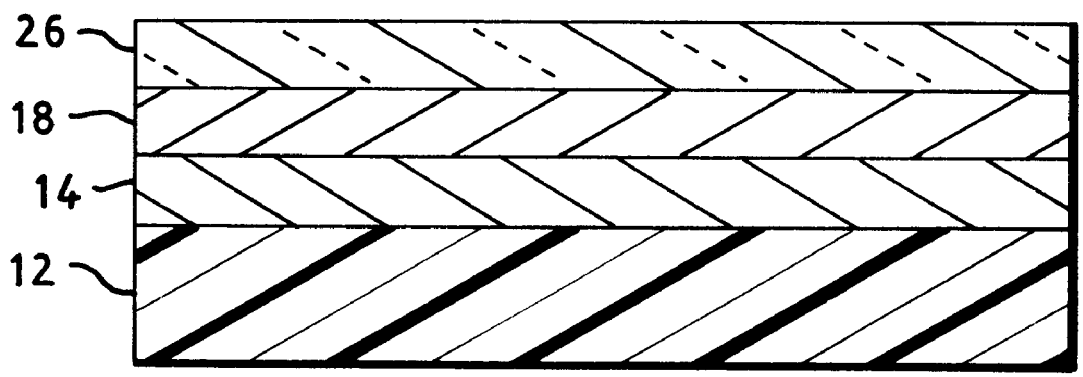

FIG. 8 shows a schematic cross sectional view of the layers of a preferred alternative embodiment of a coated vehicle headlamp reflector. The reflector 12 is coated with the inner barrier layer 14, the reflective layer 18, and then a layer of a plasma polymer of methanol 26. It is understood that methanol is not composed strictly of hydrogen and carbon, but additionally includes oxygen. The use of methanol is preferred, and as such plasma polymers of hydrogen, and carbon; or of hydrogen, carbon and oxygen are suggested. The inclusion of silicon in such a "hydrocarbon" gas is excluded.

Figure 9:
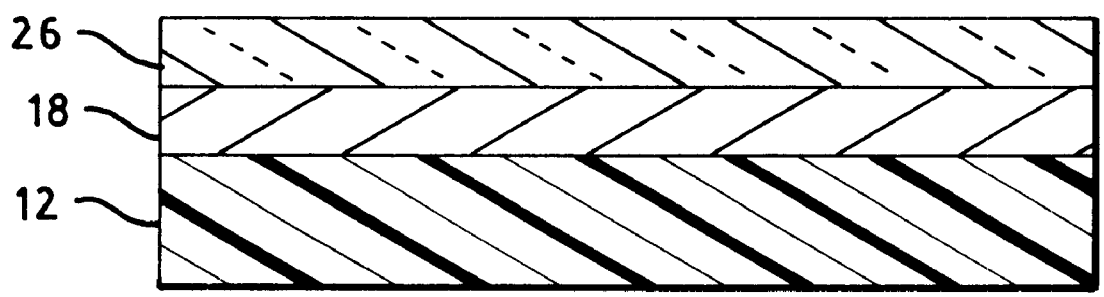

FIG. 9 shows a schematic cross sectional view of the layers of a preferred alternative embodiment of a coated vehicle headlamp reflector. The reflector 12 is coated with the reflective layer 18, and then a layer of a plasma polymer of methanol 26. This is a believed to be somewhat less functional as the outgasing protection of the inner barrier layer has been eliminated, and again the methanol polymer layer 26 may pass some chemical species that may effect the underlying reflective layer over time. Nonetheless the structure again points out the independent utility of the methanol polymer layer 26.

Figure 10:
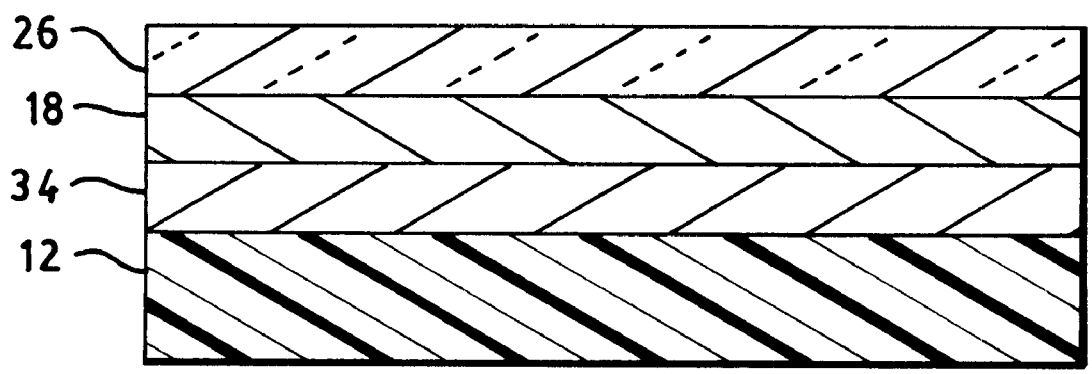

FIG. 10 shows a schematic cross sectional view of the layers of a preferred alternative embodiment of a coated vehicle headlamp reflector. The reflector 12 is coated with the adhesion layer 34, the reflective layer 18, and then a layer of a plasma polymer of methanol 26. This is a believed to be somewhat functional layered structure as the outgasing protection has been partially achieved with the adhesion layer 34, and again the methanol polymer layer 26 may pass some chemical species that may effect the underlying reflective layer over time. Nonetheless the structure again points out the use of the adhesion layer 34 and the independent utility of the methanol polymer layer 26.

The applicant currently deposits the inner barrier layer on the outer surface of the reflective region. Due to the orientation of the masking, some of the inner barrier layer wraps around toward the backside (exterior), but for the most part little of the remaining backside is coated. None the less, 60 to 70 percent of the outgasing has been eliminated by the inner barrier layer.

Samples of an existing reflector (FN-10) were made with a no base coat reflector material, and coated with the inner barrier layer, the sputtered aluminum layer, the outer barrier layer (silicone monoxide layer such as Plasil) and the protective layer such as plasma reacted methanol. The plasma polymerized layer was formed by inserting methanol into the plasma chamber during plasma generation. The plasma fragmented and polymerized the methanol resulting in a thin polymer aggregation of differing methanol segments.

The inner barrier layer has been found to improve the reflectivity of the overlaying reflective layer due to the reduction in outgasing in the vacuum aluminization process. The outgasing material is believed to intermingle with and generally interfere with the base surface, the aluminization layer, and the surface of the aluminization layer. Blocking the outgasing then improves all of these aspects. The inner barrier layer also the enhances the wetting of the aluminum particles, resulting in smoother reflective layer. In combination these aspects provide a reflective layer with greater reflectivity. It has been found by photometry that the maximum number of candelas for the no base coat reflectors coated with the inner barrier layer was increased by 25 percent over the maximum intensity in candelas for similar no base coat headlamps made without the inner barrier layer. It is evident that the plasma deposited inner barrier layer of siloxane greatly increases the reflectivity of the no base coat headlamp reflectors. This much improvement in photometry performance was not anticipated for the no base coat reflectors with a barrier coating process. The enhancement coating brings the no base coat surface quality up to the same reflective performance as the ultraviolet cured conventional coating processes for automotive lighting.

Fog lamps similarly made with an inner barrier layer of plasma deposited siloxane were found to have a 50 to 60 percent reduction in haze material formed on the reflective surface subsequent to lamp completion. The plasma deposited siloxane forms a low energy layer on the surface of the plastic resin that is believed to block migration of the resin component from outgasing. It is evident that the plasma deposited inner barrier layer substantially blocks outgasing of material from the reflector shell.

From the initial testing, the siloxane barrier layer, decreases the out-gassing and enhances the reflectivity of the no base coat headlamp reflector BMC reflectors. The barrier technology has other of beneficial results. First, the inner barrier layer reduces the out-gassing of styrene used in the no base coat reflector during operation. Second, barrier layer provides an enhanced no base coat surface before the deposition of sputtered aluminum by (a) containing the out-gassing materials under the siloxane film, and (b) the barrier layer allows the aluminum particles to wet out the siloxane surface in a uniform manor, due to suppression of reactive molecules during deposition process, thus increasing the specularity of the surface. A third benefit of the inner barrier layer is the improved adhesion of the aluminum to the no base coat substrate.

The barrier layers (inner and outer) resist oxidation of the base material, allowing the no base coat material to perform at higher temperatures than would other wise could be obtained without the coating. The barrier technology inhibits oxygen from combining with the plastic's base chemistry at elevated temperatures to stop the degradation of the structural performance.

By way of further example, test lamps were made from a filled resin chosen for no-base coat reflector manufacture (BMC Inc. 324-series). Test lamps for NS body fog lamps were made. A thin layer of a siloxane (the actual material is unknown) was plasma coated in a vacuum on the reflector surfaces, at least in the regions to be metallized. The reflectors were plasma coated in a large volume, high energy chamber (Leybold DynaMet 4V). The barrier film was deposited in about 35 seconds. A barrier layer of about between 0.1 and 0.5 microns was deposited. The plasma coated reflectors were then metallized and overcoated by standard procedures. The resulting lamps were then tested according to four different vehicle manufactures material test specifications. These are stringent durability tests for heat, humidity, mechanical strength and so on. All of the barrier coated lamp reflectors passed all of the requirements of all of the manufacturers (per lab testing). The barrier layer has been found to reduce the haze formed on the reflector after the lamp has been put into operation by 50 to 60 percent. This haze was found in prior lamps to be the result of resin materials outgasing form the reflector shell, and then condensing on the reflective surfaces. The barrier layer has also been found to provide a positive effect on the smoothness of the reflector surface, particularly in reflectors made with no base coat. BMC plastic materials, such as the one for the no base coat reflector surfaces have been adequate for some purposes, but have not been as highly reflective as the best made base coated reflector products. One of the unexpected benefits of the barrier layer is that it has been found to block oxygen from passing into the plastic shell. This suggests the plasma barrier treatment of other plastics to preserve them. This could be particularly useful in plastics used in high temperature environments, for example a less expensive plastic coated with a barrier layer could have the same or better performance than a more expensive but uncoated high temperature plastic. In one sampling, the best reflector conditions were found to use the no base coat formulation of BMC formulation, the shortest inner barrier layer cycle time (40 seconds), a moderately thin reflective film of something more than 800 Angstroms thickness and with parts preheated at 60° C. for 2 hours. The disclosed dimensions, configurations and embodiments are as examples only, and other suitable configurations.

What is claimed is:

1. A lamp reflector coated with plasma polymer comprising:
   a) a reflector shell having an inner wall including a reflective region;
   b) an inner barrier layer, formed as a plasma polymer formed from siloxane, deposited at least on the inner wall of the reflector in the reflective region;
   c) a reflective layer, formed on at least the inner barrier layer; and
   d) a protective outer layer, formed over the reflective layer, in at least the reflective region, the protective layer being a plasma polymer formed from a gas consisting essentially of carbon, hydrogen and oxygen.

2. The apparatus in claim 1, wherein the reflector is formed from a bulk filled molding material.

3. The apparatus in claim 1, wherein the hydrocarbon gas consists essentially of methanol.

4. The apparatus in claim 1, wherein the hydrocarbon gas consists essentially of carbon, and hydrogen.

5. A lamp reflector coated with plasma polymer comprising:
   a) a reflector shell having an inner wall including a reflective region;
   b) an inner barrier layer, formed as a plasma polymer formed from siloxane, deposited at least on the inner wall of the reflector in the reflective region;

c) a reflective layer, formed on at least the inner barrier layer; and d) a protective outer layer, formed over the reflective layer, in at least the reflective region, the protective layer being a plasma polymer formed from a gas consisting essentially of carbon, hydrogen and oxygen, wherein the siloxane is HMDSO.

6. A lamp reflector coated with plasma polymer comprising:

a) a reflector shell having an inner wall including a reflective region;

b) an inner barrier layer, formed as a plasma polymer formed from siloxane, deposited at least on the inner wall of the reflector in the reflective region;

c) a reflective layer, formed on at least the inner barrier layer; and d) a protective outer layer, formed over the reflective layer, in at least the reflective region, the protective layer being a plasma polymer formed from a gas consisting essentially of carbon, hydrogen and oxygen, wherein the protective layer is a plasma polymer of methanol.

* * * * *